United States Patent
Mayder et al.

(10) Patent No.: US 7,106,081 B2
(45) Date of Patent: Sep. 12, 2006

(54) PARALLEL CALIBRATION SYSTEM FOR A TEST DEVICE

(75) Inventors: Romi Mayder, San Jose, CA (US); Todd Sholl, San Jose, CA (US); Nasser Ali Jafari, Falls Church, VA (US); Andrew Tse, Castro Valley, CA (US); Randy L. Bailey, Fort Collins, CO (US)

(73) Assignee: Verigy IPco, Singapore (SG)

( * ) Notice: Subject to any disclaimer, the term of this patent is extended or adjusted under 35 U.S.C. 154(b) by 25 days.

(21) Appl. No.: 10/886,848

(22) Filed: Jul. 8, 2004

(65) Prior Publication Data

US 2006/0006896 A1    Jan. 12, 2006

(51) Int. Cl.
    *G01R 31/02*    (2006.01)
(52) U.S. Cl. .................................. 324/758
(58) Field of Classification Search ............. None
    See application file for complete search history.

(56) References Cited

U.S. PATENT DOCUMENTS

| | | | | |
|---|---|---|---|---|
| 3,832,575 A | * | 8/1974 | Dasgupta et al. ............. 326/30 |
| 5,083,083 A | * | 1/1992 | El-Ayat et al. .............. 324/538 |
| 5,212,443 A | * | 5/1993 | West et al. ................. 324/73.1 |
| 5,262,716 A | * | 11/1993 | Gregory et al. ............. 324/754 |
| 5,539,305 A | * | 7/1996 | Botka ...................... 324/158.1 |
| 6,025,708 A | * | 2/2000 | Stickler ................... 324/158.1 |
| 6,114,869 A | * | 9/2000 | Williams et al. ............ 324/765 |
| 6,192,496 B1 | * | 2/2001 | Lawrence et al. .......... 324/73.1 |
| 6,492,797 B1 | * | 12/2002 | Maassen et al. .............. 324/74 |
| 6,570,397 B1 |  | 5/2003 | Mayder et al. |
| 6,876,938 B1 | * | 4/2005 | Kattan ........................ 324/539 |
| 6,931,338 B1 | * | 8/2005 | Kattan ........................ 702/89 |
| 6,956,365 B1 | * | 10/2005 | Niv et al. ................. 324/158.1 |
| 7,043,959 B1 | * | 5/2006 | Ibane ........................ 324/766 |
| 2005/0046436 A1 | * | 3/2005 | Frankowsky et al. ....... 324/765 |

FOREIGN PATENT DOCUMENTS

GB    2293700 A  *  4/1996

\* cited by examiner

*Primary Examiner*—Jermele Hollington

(57) ABSTRACT

A parallel calibration system for an electronic circuit tester comprises test and measurement electronics, a test fixture coupled to the test and measurement electronics, the test fixture comprising clock reference circuitry and clock distribution circuitry, a device under test interface, and a plurality of calibration boards coupled to the device under test interface, wherein the plurality of calibration boards and the clock distribution circuitry simultaneously test the signal paths of a plurality of test channels.

17 Claims, 7 Drawing Sheets

PARALLEL CALIBRATION SYSTEM FOR A TEST DEVICE

BACKGROUND

Many device testing applications, such as test applications for memory devices, require a test device capable of simultaneously testing many devices having multiple test channels. Such a test device typically requires periodic calibration to, among other items, calibrate various clock and data paths through the test device so that the test device delivers meaningful test results. Modem test devices are capable of testing many devices, and therefore have many, in some cases thousands, of test channels.

A typical electronic circuit test device tests a device under test (DUT) by applying test signals of various logic states to input terminals on the DUT. The states of the signals that are produced at the output terminals of the DUT in response to the applied test signals are monitored to determine whether the DUT is behaving predictably.

An electronic circuit tester must maintain extremely accurate tolerances so that the performance of the DUT may be characterized accurately. Previous testing devices were manually calibrated using external measurement instrumentation. Other prior testing devices used a single calibration clock reference to calibrate all channels of the test device. Unfortunately, this requires that each channel of the test device be serially calibrated, thus requiring an undue amount of time to calibrate a test device having many hundreds or thousands of channels.

Accordingly, a need exists for a way of reducing the amount of time required to calibrate a test device.

SUMMARY OF INVENTION

According to one embodiment a parallel calibration system for an electronic circuit tester comprises test and measurement electronics, a test fixture coupled to the test and measurement electronics, the test fixture comprising clock reference circuitry and clock distribution circuitry. The electronic circuit tester also comprises a device under test interface and a plurality of calibration boards coupled to the device under test interface, wherein the plurality of calibration boards and the clock distribution circuitry simultaneously test the signal paths of a plurality of test channels.

Other methods, aspects and advantages of the invention will be discussed with reference to the figures and to the detailed description of the preferred embodiments.

BRIEF DESCRIPTION OF THE FIGURES

The invention will be described by way of example, in the description of exemplary embodiments, with particular reference to the accompanying figures in which.

DETAILED DESCRIPTION

While described below for use in a testing device designed to test, for example, memory devices, the parallel calibration system for a test device can be used to simultaneously calibrate multiple channels of any electronic circuit tester.

Figure 1:
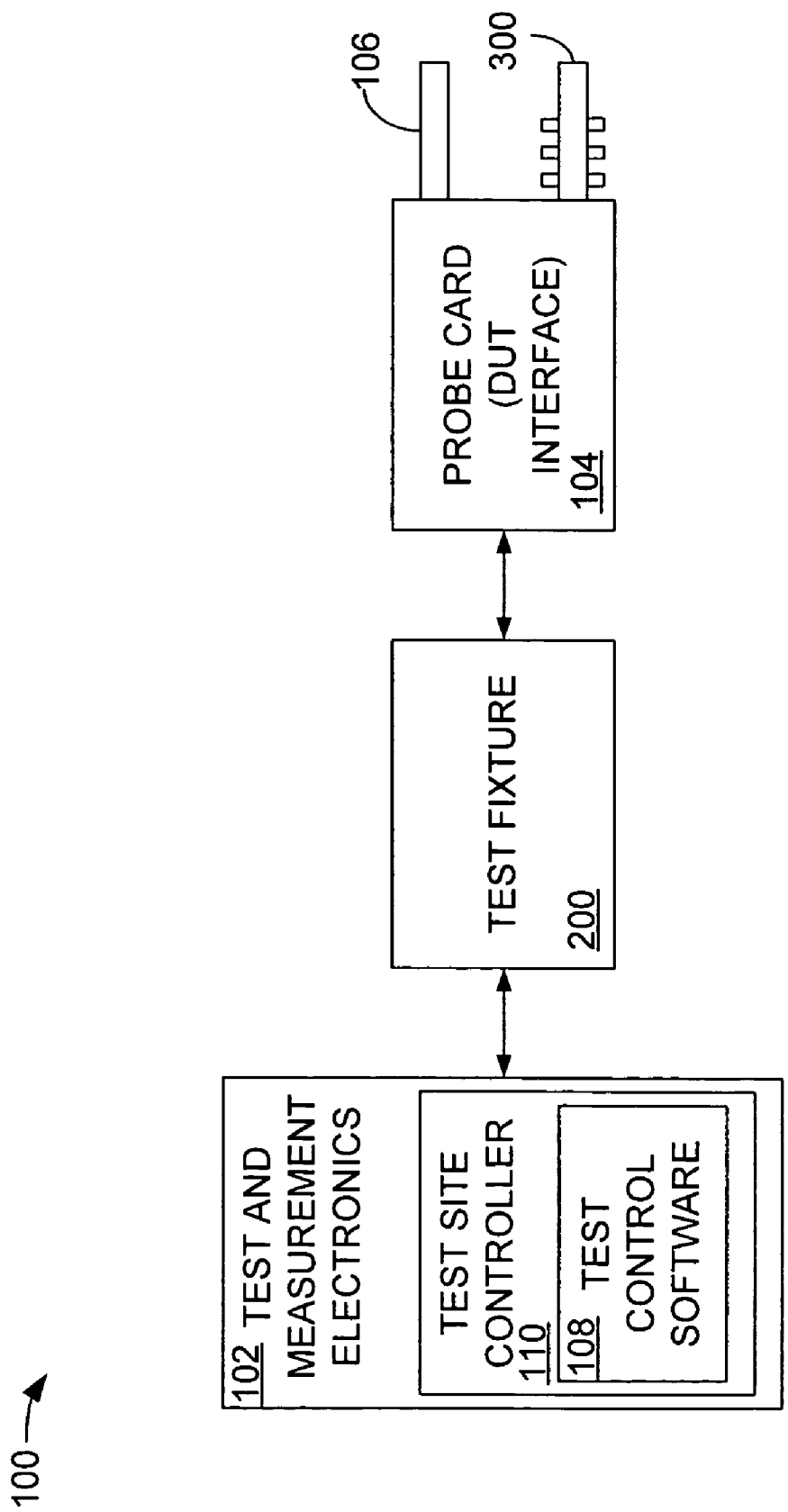
FIG. 1 is a block diagram illustrating a portion of an electronic circuit tester.

FIG. 1 is a block diagram illustrating a portion of an electronic circuit tester 100. A complete description of an electronic circuit tester can be found in commonly assigned U.S. Pat. No. 6,570,397, which is incorporated herein by reference. The electronic circuit tester 100 includes test and measurement electronics 102, a test fixture 200, sometimes also referred to as a "test head" and a probe card 104, also referred to as a "device under test interface," or "DUT interface." The test and measure electronics 102 includes a test site controller 110 that further includes test control software 108. The test site controller 110 can be, for example, a personal computer (PC) or other processing device that can control the functionality of the electronic circuit tester 100 and that can execute the test control software 108.

The test fixture 200 is electrically coupled to the test and measurement electronics 102 and to the probe card 104. The test and measure electronics 102 can include, for example, ac and dc electrical signal generators, signal analyzers, such as an oscilloscope, and a network analyzer, among other devices.

The probe card 104 provides an interface to what is referred to as a DUT board 106. When configured for testing devices, the DUT board 106 includes a plurality of, in this example, memory devices (not shown) that are to be tested by the electronic circuit tester 100. However, the electronic circuit tester 100 requires periodic calibration. Therefore, during such periodic calibration, the DUT board 106 is removed and replaced by a calibration board 300, also referred to as a "relay board." In this example, 36 calibration boards 300 can be connected to the probe card 104 to provide simultaneous calibration and verification for all test channels. The calibration board 300 is also referred to as the "relay board" because it is populated with a plurality of relays that are used to perform the calibration of the electronic circuit tester 100, as will be described below.

Figure 2:
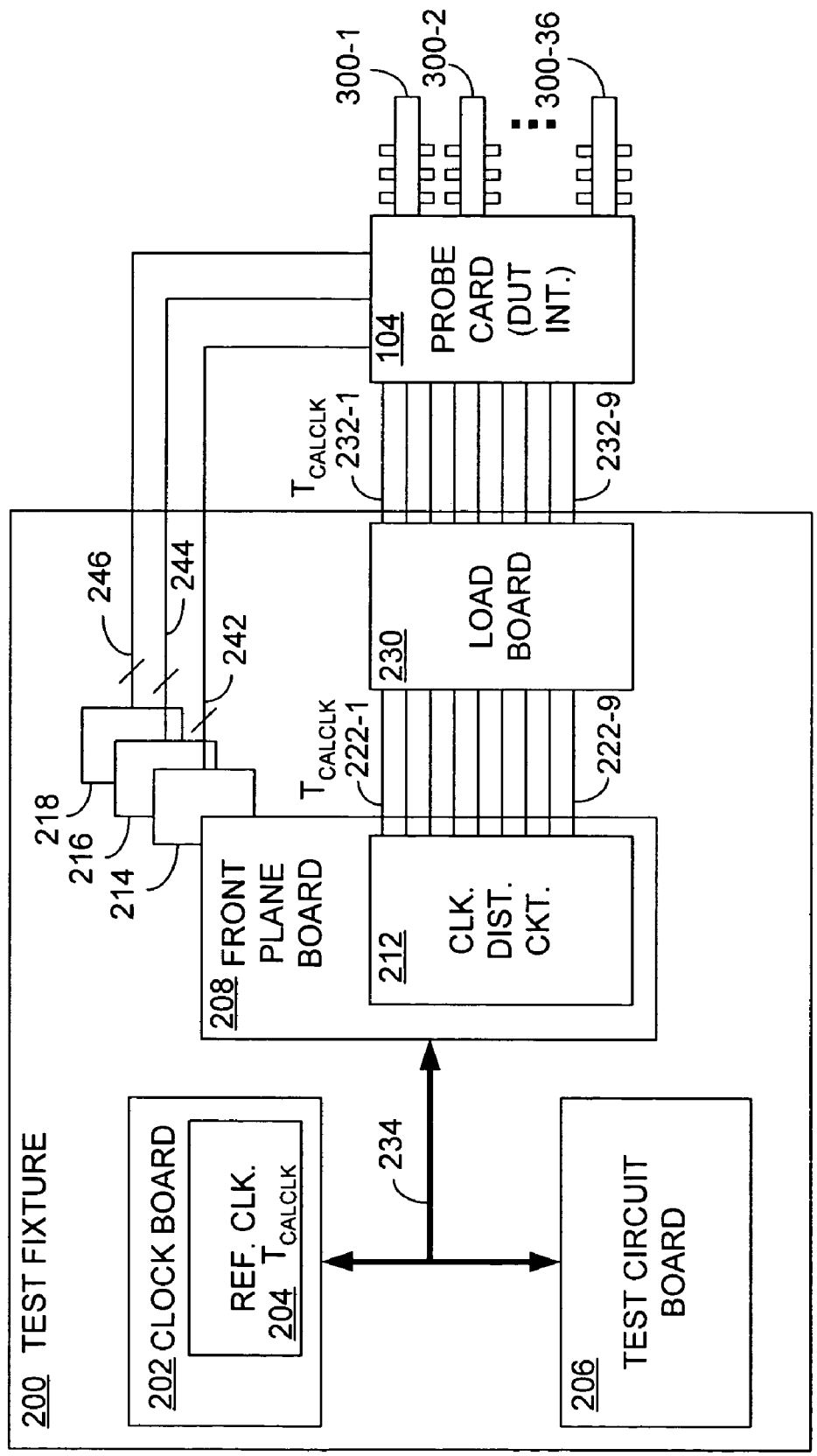
FIG. 2 is a block diagram illustrating, in greater detail, the test fixture of FIG. 1.

FIG. 2 is a block diagram illustrating, in greater detail, the test fixture 200 of FIG. 1. The test fixture 200 includes a clock board 202, a test circuit board 206, a plurality of front plane boards, an exemplary one of which is illustrated using reference numeral 208, a load board 230 and the probe card 104 of FIG. 1. The clock board 202 includes a reference clock generator 204, which generates a reference clock signal referred to as "$T_{CALCLK}$." The clock board 202, the test circuit board 206, and the front plane board 208 are coupled via interface 234.

The test circuit board 206, which may be implemented as a plurality of test circuit boards, generally includes electrical circuitry that defines test channels for testing a device or an integrated circuit. The load board 230 physically routes electrical test signals from the front plane board 208 to the probe card 204. The probe card 104 contains conductive traces that route electrical test signals from the load board 230 to a plurality of connectors (not shown) on the probe card 104 that couple the calibration boards 300 to the probe card 104.

The test circuit board 206 includes a plurality of drivers and receivers (not shown). The drivers are configured to output signals to the connectors on the probe card 104. Typically, there are a plurality of pairs of drivers and receivers on a single test circuit board 206, each pair defining a test channel of the electronic circuit tester 100.

In accordance with an embodiment of the invention, the front plane board 208 includes a clock distribution circuit 212. The clock distribution circuit 212 distributes, in this example, nine (9) identical versions of the $T_{CALCLK}$ signal via connections 222-1 through 222-9 to the load board 230. The load board 230 contains high-speed driver circuitry in an open-collector, high current configuration to drive the highly inductive loads, i.e., the relays on the calibration boards 300, coupled to the probe card 104. The load board 230 transmits the nine identical $T_{CALCLK}$ signals via connections 232-1 through 232-9 to the probe card 104. In accordance with this embodiment of the invention, front plane boards 214, 216 and 218, the detail of which is omitted, each distribute nine identical versions of the $T_{CALCLK}$ signal via connections 242, 244 and 246, respectively, to the probe card 104. In this manner, 36 identical versions of the $T_{CALCLK}$ signal are provided from the test fixture 200 to the probe card 104 to provide a clock reference signal so that all test channels can be simultaneously calibrated.

Figure 3:
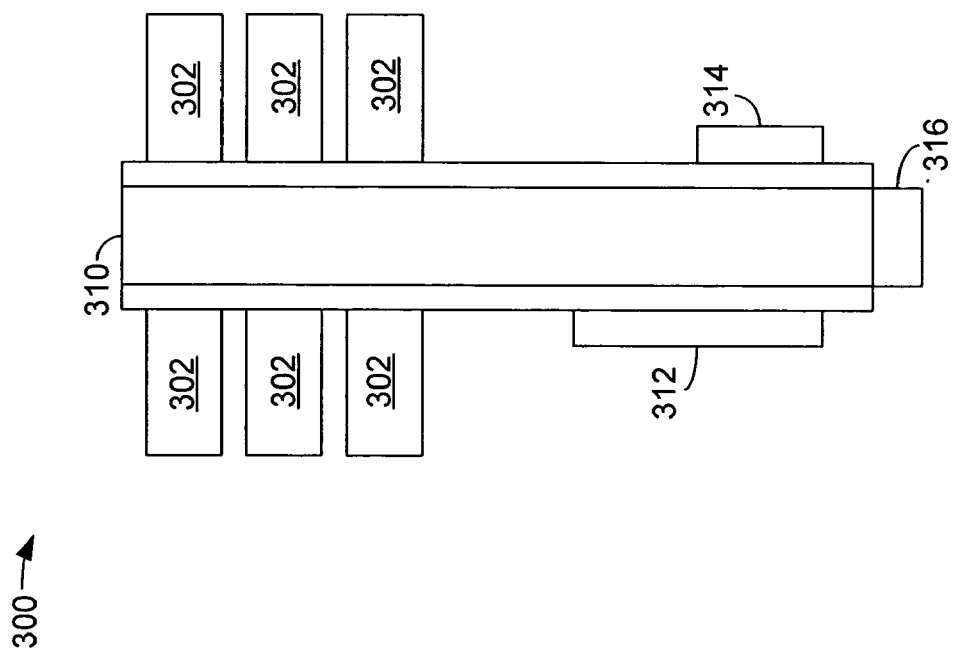
FIG. 3 is a schematic diagram illustrating the calibration board of FIGS. 1 and 2.

FIG. 3 is a schematic diagram illustrating the calibration board 300 of FIGS. 1 and 2. The calibration board 300 comprises interconnect circuitry 310, a plurality of relays, exemplary ones of which are illustrated using reference numeral 302, a status indicator 314 and a controller 312. The calibration board 300 also includes a connector 316, designed to electrically and mechanically couple the calibration board 300 to the probe card 104. In one embodiment, 36 individual calibration boards 300 are coupled to the probe card 104 to perform the simultaneous calibration of all test channels in the electronic circuit tester 100.

The circuitry 310 of the calibration board 300 is designed with optimized conductor trace routing between the relays 302 so that a high bandwidth of approximately 600 megahertz (MHz) is possible. Because the relays 302 are mounted on opposite sides of the calibration board 300, the aforementioned optimized routing between the relays is possible, thus allowing extremely high bandwidth.

Figure 4B:
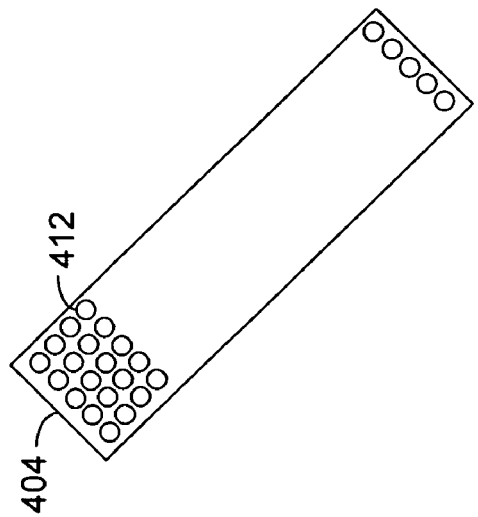
FIGS. 4A and 4B are a schematic diagram collectively illustrating the connector interface between the probe card and the calibration board.
Figure 4A:
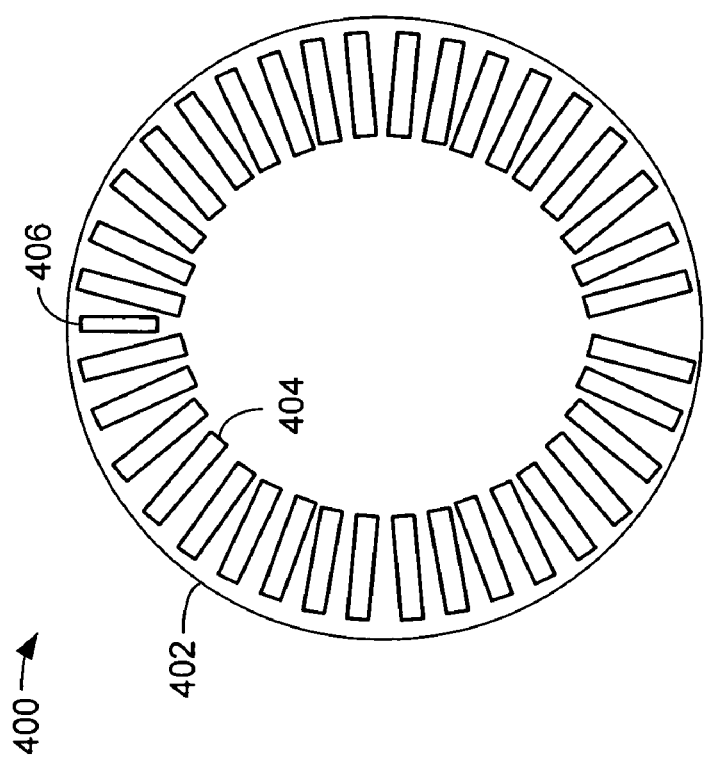

FIGS. 4A and 4B are a schematic diagram collectively illustrating the connector interface 402 between the probe card 104 and the calibration board 300. In one embodiment, the contact pads of the connector interface 402 are arranged into 36 individual test channel sites, an exemplary one of which is illustrated using reference numeral 404, and a reference site 406. In the illustrated embodiment, the connector interface 402 includes a total of 36 test channel sites 404, each configured to include 128 test channels, and each configured to receive one of the identical $T_{CALCLK}$ signals described above.

Referring now to FIG. 4B, each test channel site 404 includes a high density layout of contact pads 412 that are exposed for contact with a respective test connector 316 located on the calibration board 300. In the embodiment shown in FIG. 4B, each test channel site 404 includes 128 connector pads 412. The reference site 406 includes contact pads that are exposed for contact with various reference connectors on the probe card 104. In this manner, 36 calibration boards 300 can be simultaneously mounted to the connector interface 402, to allow simultaneous calibration of all 4,000+ test channels formed by the network created by the 128×36 test channels.

Figure 5:
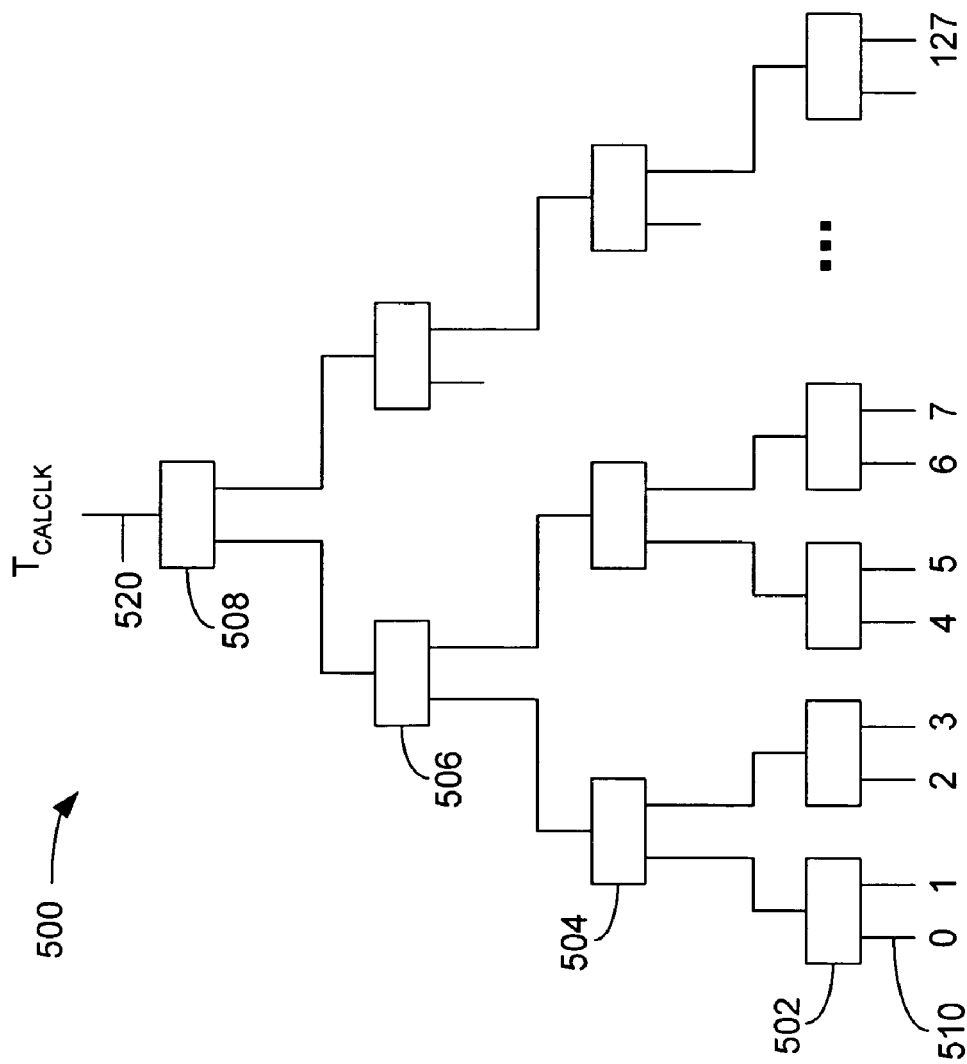
FIG. 5 is a schematic diagram illustrating an intra-site connection network corresponding to one test channel site of FIGS. 4A and 4B.

FIG. 5 is a schematic diagram illustrating an intra-site connection network 500 corresponding to one test channel site 404 of FIGS. 4A and 4B. The contact pads 412 (FIG. 4B) of each test channel site 404 are connected through the layers of the circuitry 310 of the calibration board 300 to a respective input terminal, an exemplary one of which is illustrated at 510, of an intra-site switching network 500. The intra-site switching network 500 is configured to selectively connect each of the contact pads 412 of a given test channel site to an output terminal 520 of the corresponding intra-site switching network 500. The output terminal 520 corresponds to one of the connections 222 and 232 in FIG. 2, and carries the $T_{CALCLK}$ signal.

In one embodiment, the intra-site switching network 500 is implemented as a tree matrix of high performance relays, exemplary ones of which are illustrated using reference numerals 502, 504, 506 and 508, each of which operate as a bidirectional single-pole double-throw switch that is controlled by a control signal received from the controller 312 of the calibration board 300. In accordance with this embodiment, each of the pads 412 of the test channel site 404 is connected up to a single $T_{CALCLK}$ signal, illustrated using reference numeral 520 in FIG. 5.

Figure 6:
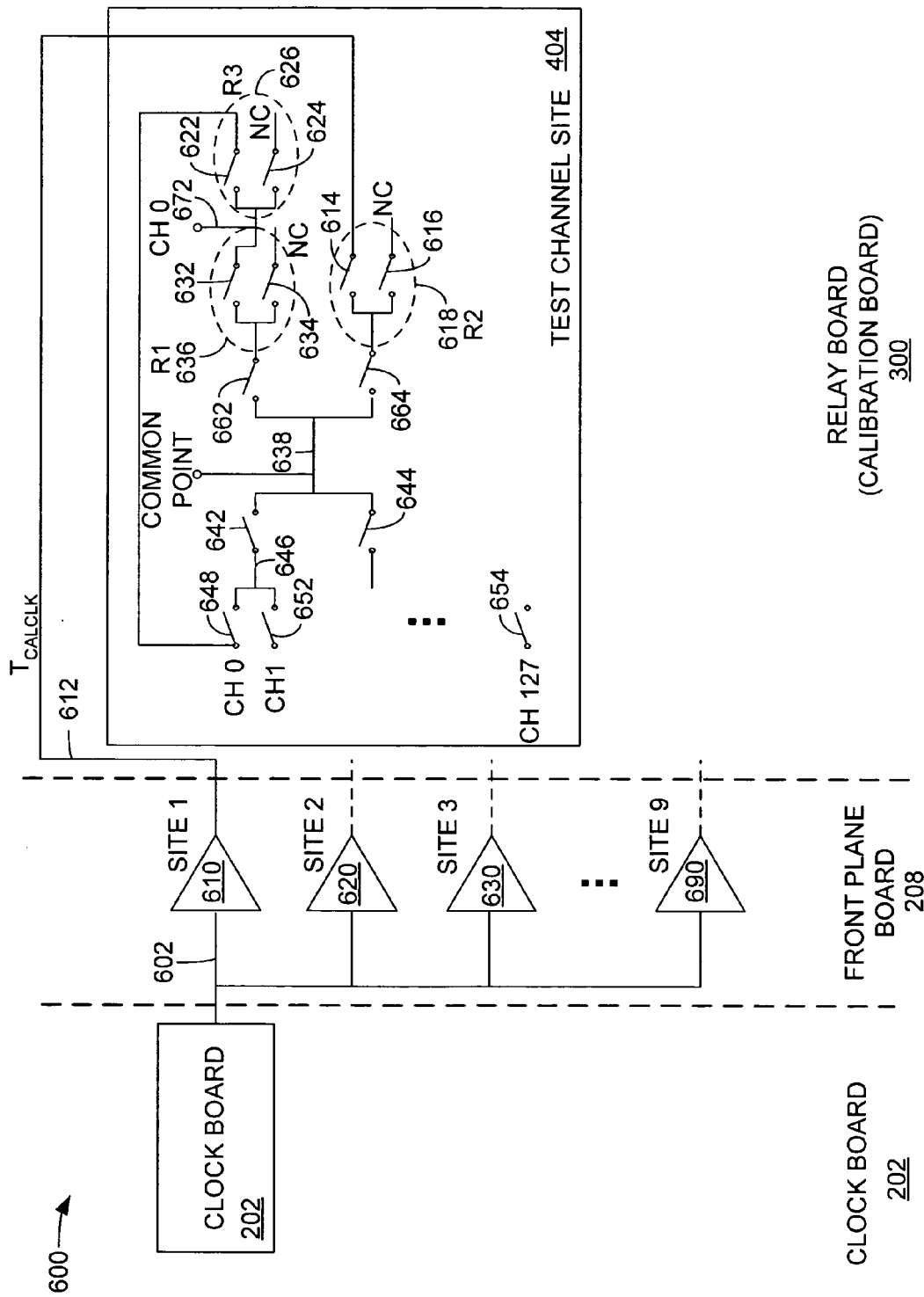
FIG. 6 is a schematic diagram illustrating a resource matrix of the electronic circuit tester of FIG. 1.

FIG. 6 is a schematic diagram illustrating a resource matrix 600 of the electronic circuit tester 100. The resource matrix 600 schematically illustrates components of the clock board 202, the front plane board 208 and the calibration board 300. The clock board 202 provides the $T_{CALCLK}$ signal via connection 602 to each of nine (9) test sites, referred to using reference numerals 610 through 690. The test sites in FIG. 6 correspond to the test sites 404 of FIGS. 4A and 4B. For simplicity of illustration, only a single test site 610 will be described.

The $T_{CALCLK}$ signal is supplied to test site 610 and is supplied via connection 612 to one of the test channel sites, test channel site 404 in this example. The test channel site 404 comprises a plurality of switches that form resistance values. The test site 404 includes switches 632 and 634, which form a first resistance 636, switches 614 and 616, which form a second resistance 618, and switches 622 and 624, which form a third resistance 626. This architecture is repeated for the 128 test channels in each test channel site. The $T_{CALCLK}$ signal is provided to switch 614, which in combination with switch 616 provides the second resistance 618. The switches 662 and 664 send the calibration signal via connection 638 which is referred to as a "common point." The connection 672 is referred to as the "channel zero" connection. The switches 648, 652 and 654 represent the switches of each of the 128 channels located on the test channel site 404. Using a configuration as shown in FIG. 6, it is possible to calibrate simultaneously all the test channels of the electronic circuit tester 100 as described above.

Figure 7:
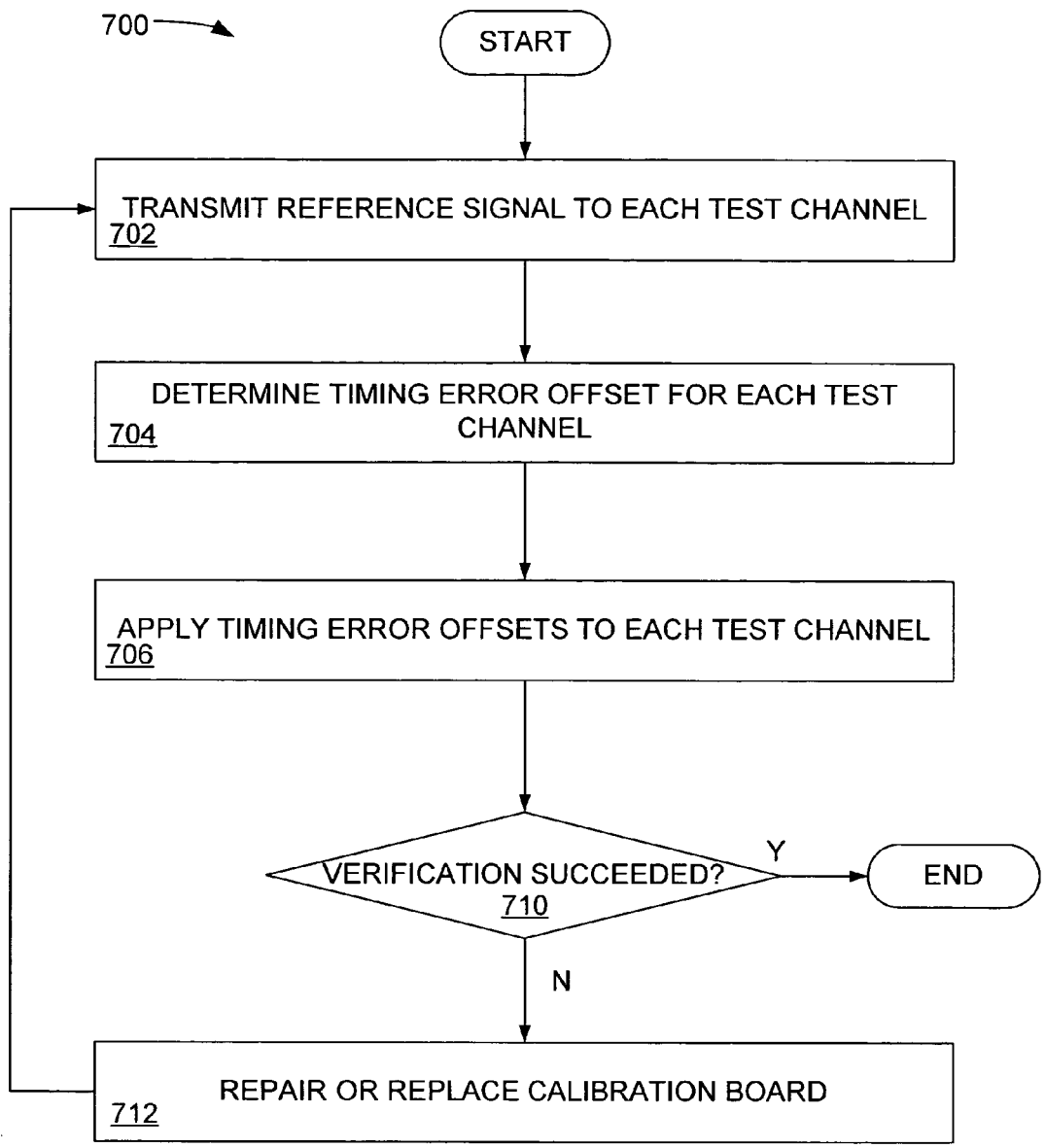
FIG. 7 is a flow chart illustrating the operation of an embodiment of the electronic circuit tester of FIG. 1.

FIG. 7 is a flow chart illustrating the operation of an embodiment of the electronic circuit tester 100. The blocks in the flow chart of FIG. 7 represent one embodiment of the parallel calibration system for a test device and can be executed in the order shown, out of the order shown, or can be executed substantially in parallel. In one embodiment, the timing of each channel in the electronic circuit tester 100 may be simultaneously calibrated and the timing calibration verified. In block 702, the calibration reference signal $T_{CALCLK}$ is transmitted to each test channel. In the illustrated embodiment, the calibration reference signal is received from a test connection contacting a contact pad in the reference site 406 of FIG. 4A. In block 704, the timing error offset for each test channel is determined based upon the transmitted calibration reference signal. The timing error offset may be measured in a conventional way and stored, for example, in a capture memory of the test site controller 110. Next, in block 706, the determined timing offsets are applied to each test channel. Next, in block 710, the timing calibration is verified under multiple pulses, multiple voltages, and multiple formats in accordance with one or more conventional timing calibration verification protocols. For example, edge placement accuracy may be verified and the rise time, cable length and error offset for an edge of each test channel may be determined in accordance with methods described in U.S. Pat. No. 6,192,496, which is incorporated herein by reference. If the calibration for each test channel is successfully verified in step 710, the process ends. Otherwise, the calibration board 300 is repaired or replaced in step 712 and the timing calibration verification process is repeated beginning at step 702. The above described embodiments provide an efficient and cost effective approach for both calibrating the timing and verifying the timing calibration of the electronic circuit tester 100. In particular, by transmitting 36 identical versions of the $T_{CAL\_CLK}$ signal from the test fixture 200 to the calibration boards 300, timing errors associated with external wires and cables may be avoided.

The foregoing detailed description has been given for understanding exemplary implementations of the invention only and no unnecessary limitations should be understood therefrom as modifications will be obvious to those skilled in the art without departing from the scope of the appended claims and their equivalents.

We claim:

1. A parallel calibration system for an electronic circuit tester, comprising:
   test and measurement electronics;
   a test fixture coupled to the test and measurement electronics, the test fixture comprising clock reference circuitry and clock distribution circuitzy configured to provide a plurality of substantially identical clock reference signals, each substantially identical clock reference signal being supplied to a corresponding test channel site;
   a device under test interface; and
   a plurality of calibration boards coupled to the device under test interface, wherein the plurality of calibration boards and the clock distribution circuitry simultaneously test all the signal paths of a plurality of test channel sites in parallel.

2. The parallel calibration system of claim 1, wherein the test fixture further comprises test circuitry configured to define a plurality of test channels.

3. The parallel calibration system of claim 2, wherein each of the plurality of calibration boards corresponds to a dedicated clock reference signal.

4. The parallel calibration system of claim 3, wherein each test channel is referenced to a common point and the common point is referenced to the clock reference signal.

5. The parallel calibration system of claim 4, wherein each calibration board is orthogonally oriented with respect to the device under test interface and further comprises relays on opposing surfaces of the calibration board.

6. The parallel calibration system of claim 4, wherein the relays are electrically coupled to provide a bandwidth of 600 megahertz (MHz).

7. A method for operating an electronic test device, comprising:
   providing test and measurement electronics;
   providing a test fixture coupled to the test and measurement electronics, the test fixture comprising clock reference circuitry and clock distribution circuitry configured to provide a plurality of substantially identical clock reference signals, each substantially identical clock reference signal being supplied to a corresponding test channel site;
   providing a device under test interface; and
   providing a plurality of calibration boards coupled to the device under test interface, wherein the plurality of calibration boards and the clock distribution circuitry simultaneously test all the signal paths of a plurality of test channel sites in parallel.

8. The method of claim 7, wherein the test fixture further comprises test circuitry configured to define a plurality of test channels.

9. The method of claim 8, wherein each of the plurality of calibration boards corresponds to a dedicated clock reference signal.

10. The method of claim 9, further comprising referencing each test channel to a common point and referencing common point is referenced to the clock reference signal.

11. The method of claim 10, further comprising orienting each calibration board orthogonally with respect to the device under test interface and further comprising providing relays on opposing surfaces of the calibration board.

12. The method of claim 11, wherein the relays are electrically coupled to provide a bandwidth of 600 megahertz (MHz).

13. A parallel calibration system for a test device, comprising:
   test and measurement electronics;
   a test fixture coupled to the test and measurement electronics, the test fixture comprising clock reference circuitry and clock distribution circuitry, the clock reference circuitry configured to generate a plurality of substantially identical reference clock signals and configured to provide the plurality of substantially identical clock reference signals to a corresponding plurality of test channel sites;
   test circuitry configured to define a plurality of test channels in each test channel site;
   a device under test interface; and
   a plurality of calibration boards coupled to the device under test interface, wherein the plurality of calibration boards and the clock distribution circuitry simultaneously test all the signal paths of the plurality of test channels in each test channel site in parallel.

14. The parallel calibration system of claim 13, wherein each of the plurality of calibration boards corresponds to a dedicated clock reference signal.

15. The parallel calibration system of claim 14, wherein each test channel is referenced to a common point and the common point is referenced to each clock reference signal.

16. The parallel calibration system of claim 15, wherein each calibration board is orthogonally oriented with respect to the device under test interface and further comprises relays on opposing surfaces of the calibration board.

17. The parallel calibration system of claim 16, wherein the relays are electrically coupled to provide a bandwidth of 600 megahertz (MHz).

* * * * *